(12) United States Patent
Zhu et al.

(10) Patent No.: US 7,416,986 B2
(45) Date of Patent: Aug. 26, 2008

(54) TEST STRUCTURE AND METHOD FOR DETECTING VIA CONTACT SHORTING IN SHALLOW TRENCH ISOLATION REGIONS

(75) Inventors: Huilong Zhu, Poughkeepsie, NY (US); Shih-Fen Huang, Bronxville, NY (US); Effendi Leobandung, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 11/469,940

(22) Filed: Sep. 5, 2006

(65) Prior Publication Data

US 2008/0057667 A1   Mar. 6, 2008

(51) Int. Cl.
*H01L 21/311* (2006.01)

(52) U.S. Cl. .................. 438/700; 438/270; 438/680; 257/E21.17; 257/E21.278; 257/E21.521; 257/E21.585

(58) Field of Classification Search ................ 438/700, 438/270, 680, 723, 756, 740, 753, 785; 257/396, 257/774, 763
See application file for complete search history.

(56) References Cited

U.S. PATENT DOCUMENTS

| | | | |
|---|---|---|---|
| 5,773,215 A * | 6/1998 | Hanausek-Walaszek et al. | 435/6 |
| 5,916,715 A | 6/1999 | Fulford, Jr. et al. | |
| 6,391,669 B1 | 5/2002 | Fasano et al. | |
| 6,475,871 B1 | 11/2002 | Stine et al. | |
| 6,545,753 B2 * | 4/2003 | Subramanian et al. | 356/237.5 |
| 6,774,989 B1 * | 8/2004 | Rangarajan et al. | 356/237.2 |
| 6,822,333 B1 | 11/2004 | Yu | |
| 6,921,672 B2 * | 7/2005 | Satya et al. | 438/18 |
| 6,995,392 B2 | 2/2006 | McLaughlin et al. | |
| 7,078,313 B2 | 7/2006 | Kirchhoff | |
| 7,198,963 B2 * | 4/2007 | Verma et al. | 438/14 |
| 2004/0262604 A1 | 12/2004 | Lee | |
| 2005/0085032 A1 | 4/2005 | Aghababazadeh et al. | |
| 2005/0282350 A1 | 12/2005 | Chou et al. | |
| 2006/0022695 A1 | 2/2006 | Barish et al. | |

* cited by examiner

*Primary Examiner*—David Nhu
(74) *Attorney, Agent, or Firm*—Cantor Colburn LLP; Rosa Yaghmour

(57) ABSTRACT

A test structure for detecting void formation in semiconductor device layers includes a plurality of active device areas formed in a substrate, a plurality of shallow trench isolation (STI) regions separating the active device areas, a plurality of gate electrode structures formed across the active device areas and the STI regions, and a matrix of vias formed over the active device areas and between the gate electrode structures. At least one edge of each of a pair of vias at opposite ends of a given one of the STI regions extends at least out to an edge of the associated active device area.

4 Claims, 5 Drawing Sheets

TEST STRUCTURE AND METHOD FOR DETECTING VIA CONTACT SHORTING IN SHALLOW TRENCH ISOLATION REGIONS

BACKGROUND

The present invention relates generally to semiconductor device processing techniques and, more particularly, to a test structure and method for detecting via contact shorting above shallow trench isolation (STI) regions of a semiconductor device.

As the size of integrated circuit devices continues to shrink, the level of integration increases while the structures for electrically isolating devices also reduces correspondingly. For example, the conventional field oxide layer formed by the local oxidation of silicon (LOCOS) method is no longer suitable as an isolation structure when the device is increasingly miniaturized, due in part to the so-called bird's beak encroachment that often leads to the production of leakage current.

Because of the difficulties in fabricating miniaturized isolating devices, other methods of isolating devices have been developed. One of the most widely adopted isolation methods for sub micron devices is to form a shallow trench isolation (STI) structure, wherein trenches are defined within a substrate surface and then prepared for filling with dielectric materials. The resulting trenches typically display a steep sidewall profile as compared to LOCOS oxidation. The trenches are subsequently refilled with a dielectric such as chemical vapor deposited (CVD) silicon dioxide ($SiO_2$). In contrast, "active" regions are regions in which active devices (e.g., source/drain diffusions) are fabricated, and which lie between the trenches.

Before formation of metal via contacts, it is usually required to deposit a protection layer (most commonly using nitride) to protect devices from mobile ions and moisture, as well as to provide a etch stopper for etching contact holes. One problem, however, associated with decreasing device size and pitch (spacing) between structures such as transistor gate electrodes is that of voiding when protection layers are conformally deposited over the gate and spacer structures. The voids are easily formed when an aspect ratio between gate height and pitch is high. Due to multiple steps of etching, cleaning, and photoresist stripping before depositing the protection layer, the surface level of STI regions is much lower than active area (i.e., the Si surfaces). Therefore, the aspect ratio between gate height and pitch in STI regions usually is larger than that in active areas. Thus, the voids are more easily formed above STI areas than active areas. In some cases, the voids are formed only above STI regions and not at all formed in active areas.

Consequently, when an insulative material (e.g., oxide) is then blanket deposited over the protection layer, the pinching of protection layer prevents the oxide from filling the voids. Then, during subsequent via formation, the metal fill material (e.g., tungsten or TiN) can also end up filling the void if the via contact holes connect to the void, thereby creating undesirable "stringers" that can short adjacent vias to one another. Accordingly, it is desirable to be able to efficiently detect a potential stringer problem in the formation of such semiconductor devices.

SUMMARY

The foregoing discussed drawbacks and deficiencies of the prior art are overcome or alleviated by, in an exemplary embodiment, a test structure for detecting void formation in semiconductor device layers, including a plurality of active device areas formed in a substrate; a plurality of shallow trench isolation (STI) regions separating the active device areas; a plurality of gate electrode structures formed across the active device areas and the STI regions; and a matrix of vias formed over the active device areas and between the gate electrode structures, wherein at least one edge of each of a pair of vias at opposite ends of a given one of the STI regions extends at least out to an edge of the associated active device area.

In another embodiment, a method for detecting void formation in semiconductor device layers includes forming a plurality of active device areas in a substrate; forming a plurality of shallow trench isolation (STI) regions separating the active device areas; forming a plurality of gate electrode structures across the active device areas and the STI regions; and forming a matrix of vias formed over the active device areas and between the gate electrode structures, wherein at least one edge of each of a pair of vias at opposite ends of a given one of the STI regions extends at least out to an edge of the associated active device area.

TECHNICAL EFFECTS

As a result of the summarized invention, a solution is technically achieved in which metal stringer formation in semiconductor devices is efficiently detected through configuration of via test structures that extend at least to the edge of the active area, and into the STI region in other embodiments. This allows the test vias to be shorted circuited by metal voids that are present in the STI regions, but not in active area of the device.

BRIEF DESCRIPTION OF THE DRAWINGS

Referring to the exemplary drawings wherein like elements are numbered alike in the several Figures.

DETAILED DESCRIPTION

Disclosed herein is a novel test structure for detecting metal (e.g., tungsten stringer formation between gate electrode structures of semiconductor devices. Briefly stated, the footprint of test via structures is adjusted so as to be at least aligned with the edge of the active area (and in other embodiments within the STI regions) such that the voids that primarily formed in the STI regions can be detected through shorting of the test vias.

Figure 1:
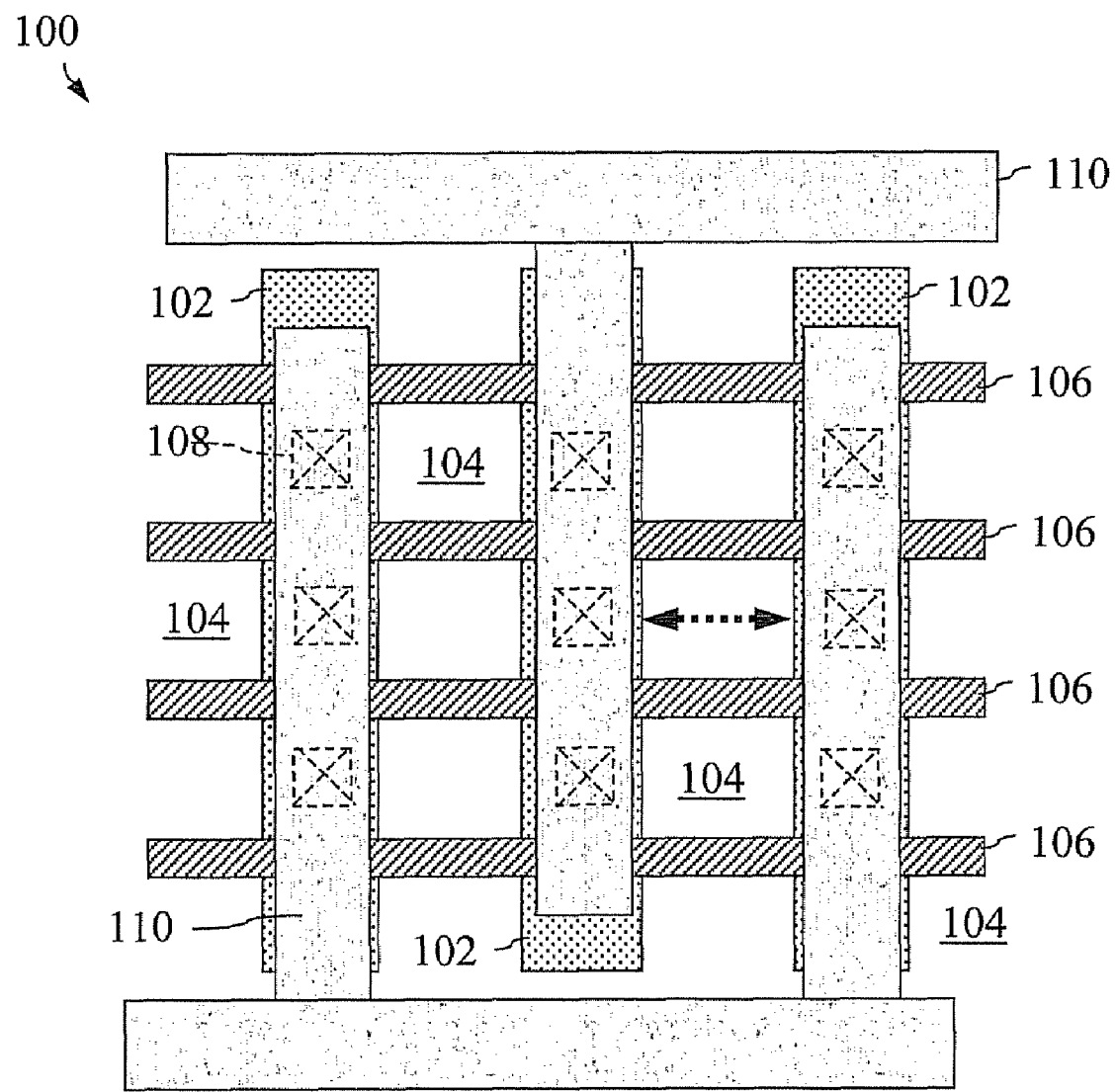
FIG. 1 is a schematic top view of a conventional test structure matrix for detecting stringer shorts.

Referring initially to FIG. 1, a schematic top view of a conventional test structure 100 for detecting stringer shorts is illustrated. In the view depicted, regions 102 represent active areas of the device (e.g., silicon regions doped with source and drain regions). The active areas 102 are separated by STI regions 104 at the substrate level. In addition, a plurality of gate electrode structures 106 (e.g., polysilicon) are shown horizontally disposed across the active areas and STI regions. As also illustrated, the test structure includes a matrix of vertically disposed vias 108 connecting the substrate level to a first metal level, including conductors 110.

As will be noted from FIG. 1, the footprint of the vias 108 in the conventional test structure is such that the vias 108 are completely confined within the active areas 102. Therefore, any void (depicted as a dashed arrow) formed through an STI region 104 (e.g., in the manner described above) but not extending into the active areas 102 would not be filled with via metal. This is because the outer edges of the vias 108, being contained entirely within the active areas 102, do not meet up with the ends of the voids. Thus, vias 108 in test structure 100 do not efficiently detect the presence of voids in the STI regions 104.

Figure 2:
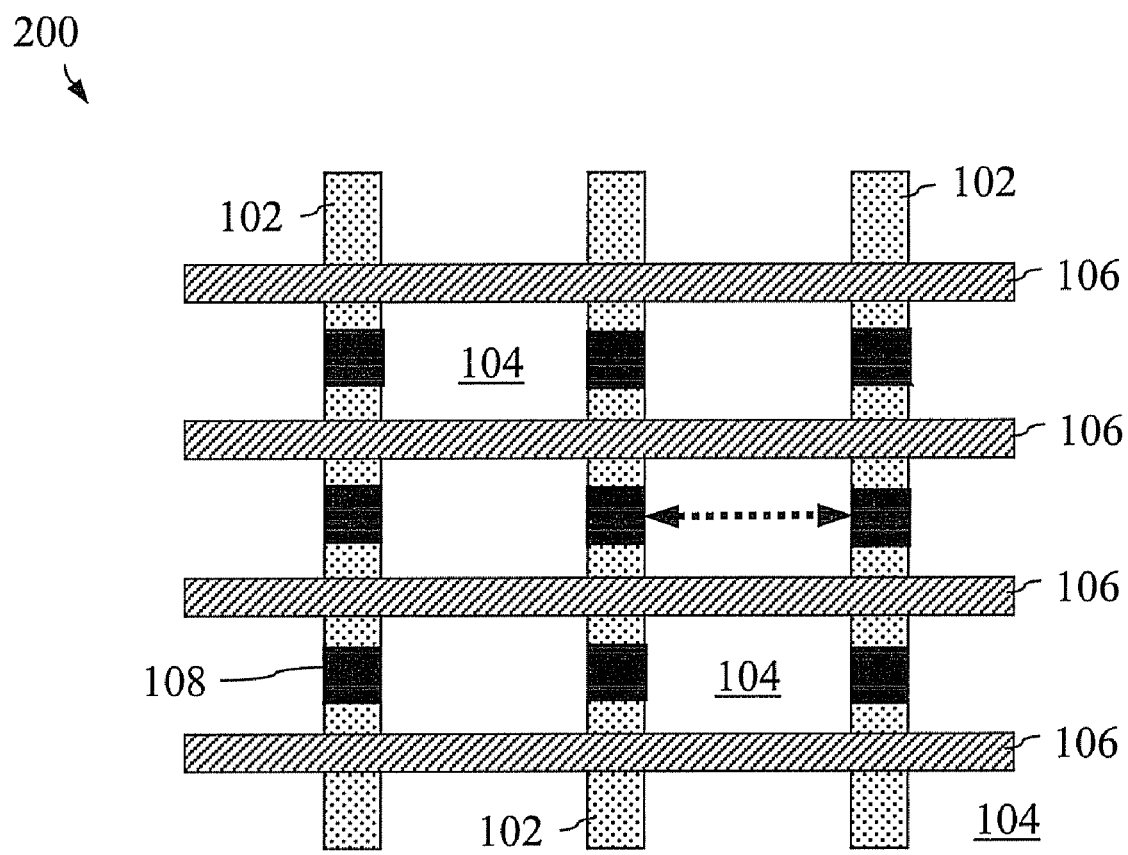
FIG. 2 is a schematic top view of a test structure for detecting stringer shorts, in accordance with a first exemplary embodiment of the invention.

Therefore, in accordance with a first exemplary embodiment of the invention, FIG. 2 is a schematic top view of a test structure 200 for detecting stringer shorts. For purposes of simplicity, the metal wiring above the vias is not illustrated in order to more clearly illustrate the via footprint with respect to the active area and STI area. In this first embodiment, it will be seen that the vias 108 are dimensioned such that the edges thereof are aligned to the edges of the active area 102, along the width of the active area. That is, the width of the vias 108 is equivalent to the width of the active areas 102. In this manner, any void (dashed arrow) formed within an STI region 104 will meet the edges of a pair of vias 108 in the text matrix since they extend out to the edge of the active areas 102 at the border of the STI region 104. Accordingly, when the vias adjacent the void are filled with conductive material (e.g., tungsten and/or TiN), the materials also enters the void so as to form a stringer. Because the stringer will create a short between the vias at opposite ends thereof, the stringer can in turn be detected through suitable probing of the structure, such as resistance changes among the voids.

Figure 3:
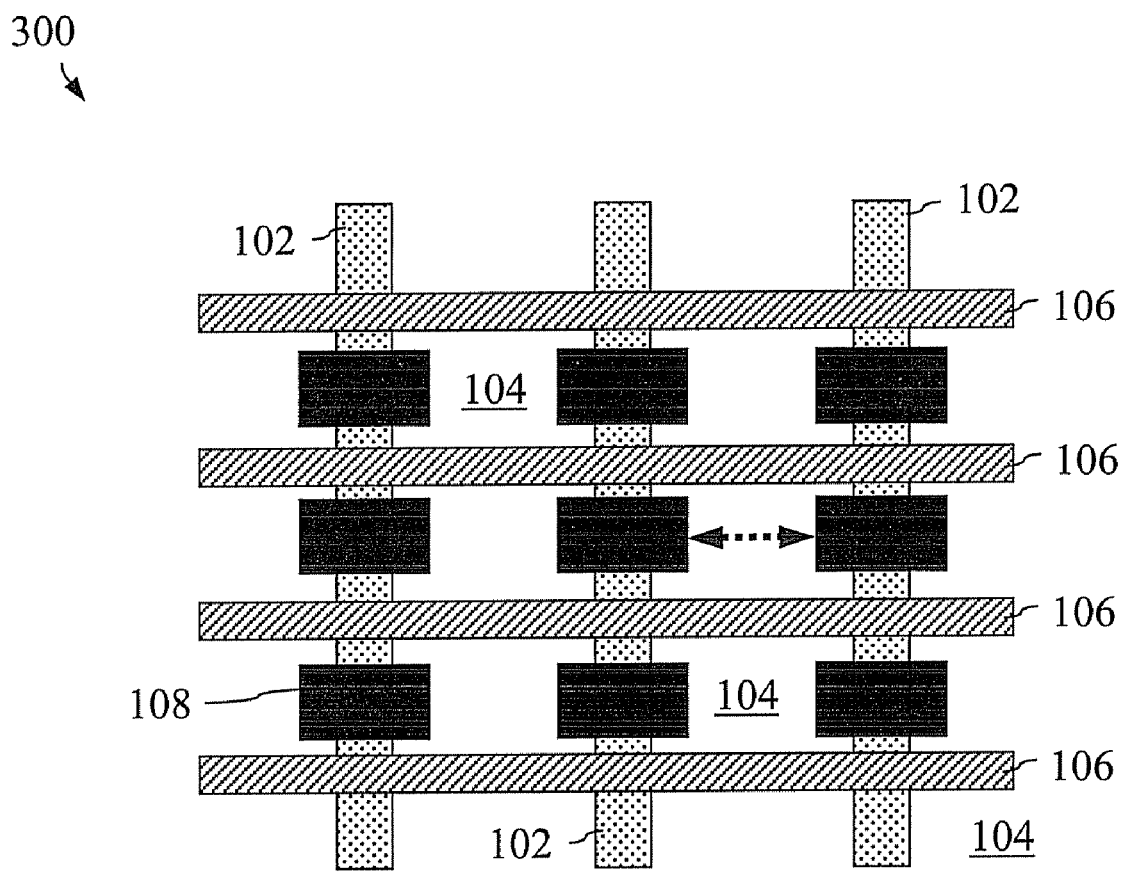
FIG. 3 is a schematic top view of a test structure for detecting stringer shorts, in accordance with a second exemplary embodiment of the invention.

FIG. 3 is a schematic top view of another test structure 300 for detecting stringer shorts, in accordance with a second exemplary embodiment of the invention. Whereas as the vias 108 in the FIG. 2 embodiment extend out to the edges of the active area 102, it will be seen that the vias 108 in FIG. 3 actually extend beyond (both sides) the active area 102 and into the neighboring STI region 104. The expanded via structures of FIG. 3 can more effectively insure that the metal deposition therein will extend into the STI voids and create detectable metal stringers that short adjacent vias.

Figure 4:
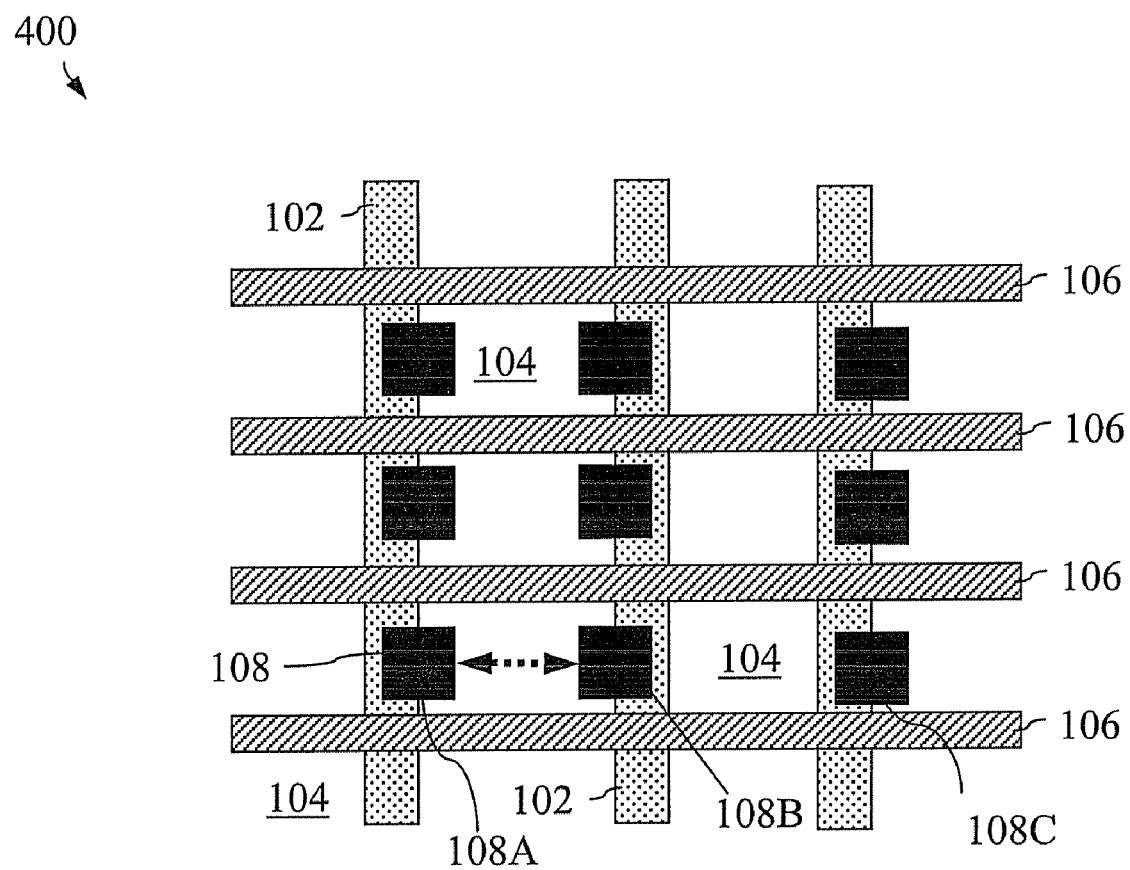
FIG. 4 is a schematic top view of a test structure for detecting stringer shorts, in accordance with a third exemplary embodiment of the invention.

In still another embodiment, FIG. 4 is a schematic top view of a test structure 400 for detecting stringer shorts, in accordance with a third exemplary embodiment of the invention. In lieu of patterning the vias 108 such that the edges thereof extend over both sides of the active area 102, only one side of a given via extends past the active area and into a given STI region 104. The opposite edge of that given via may remain within the confines of the active area (as shown in FIG. 4), or could alternatively be aligned to the opposite side of the active area. In any event, where a via extends into a given STI region, another via on the opposite side of that same STI region should at least extend to the edge of that STI region, if not into the STI region. This structure may thus be used to detect if the voids are formed only above STI. For example, if the shorting is found between 108A and 108B, but not between 108B and 108C, this indicates that the voids are formed only above STI areas.

Figure 5:
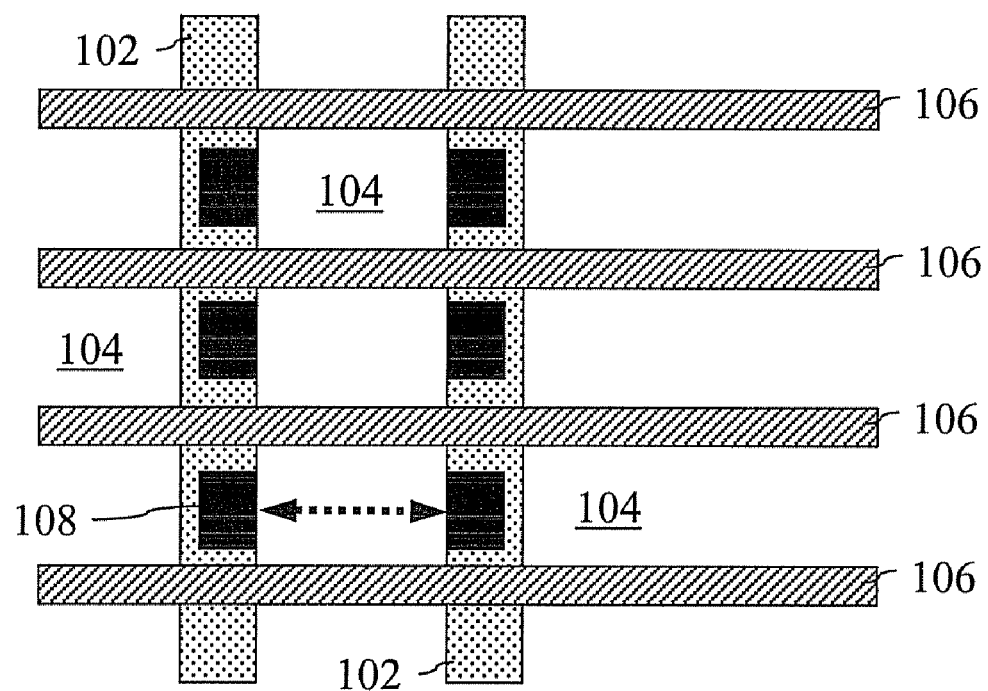
FIG. 5 is a schematic top view of a test structure for detecting stringer shorts, in accordance with a fourth exemplary embodiment of the invention.

Finally, FIG. 5 is a schematic top view of still another test structure 500 for detecting stringer shorts, in accordance with a fourth exemplary embodiment of the invention. In this embodiment, at least one STI region 104 has a first via extending out to a first edge thereof and a second via extending out to a second (opposite edge thereof). In the embodiment shown, the opposite edges of the first and second vias remain within the respective active areas 102.

It will be appreciated that other combinations of via footprints are also contemplated, such that at least one edge of at least two or more vias extend to the edges of the active areas and adjacent an STI region, such that voids formed within the STI region may be more easily detected through the formation of stringers that short a pair of vias to one another in a test structure.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for detecting void formation in semiconductor device layers, the method comprising:

forming a plurality of active device areas in a substrate;

forming a plurality of shallow trench isolation (STI) regions separating the active device areas;

forming a plurality of gate electrode structures across the active device areas and the STI regions; and forming a matrix of vias formed over the active device areas and between the gate electrode structures;

wherein at least one edge of each of a pair of vias at opposite ends of a given one of the plurality of STI regions extends at least out to an edge of the associated active device area, and wherein the matrix of vias is disposed so as to result in metal fill of a void formed within one of the STI regions, thereby resulting in a short between a pair of the vias disposed at opposite ends of the void.

2. The method of claim 1, wherein the at least one edge of each of the pair of vias further extends beyond the edge of the associated active device area and into the given one of the STI regions.

3. The method of claim 1, wherein opposite edges of each of the vias extend at least out to a corresponding edge of the associated active device area.

4. The method of claim 3, wherein the opposite edges of each of the vias extends beyond the corresponding edges of the associated active device area and into an adjacent one of the STI regions.

* * * * *